(12) United States Patent
Basu et al.

(10) Patent No.: US 9,041,109 B2
(45) Date of Patent: May 26, 2015

(54) FIELD EFFECT TRANSISTOR INCLUDING A RECESSED AND REGROWN CHANNEL

(71) Applicant: International Business Machines Corporation, Armonk, NY (US)

(72) Inventors: Anirban Basu, Elmsford, NY (US); Pouya Hashemi, White Plains, NY (US); Ali Khakifirooz, Mountain View, CA (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/031,362

(22) Filed: Sep. 19, 2013

(65) Prior Publication Data
US 2015/0076604 A1 Mar. 19, 2015

(51) Int. Cl.
| H01L 21/02 | (2006.01) |
| H01L 21/20 | (2006.01) |
| H01L 21/36 | (2006.01) |
| H01L 29/78 | (2006.01) |
| H01L 29/66 | (2006.01) |

(52) U.S. Cl.
CPC ........ H01L 29/785 (2013.01); H01L 29/66795 (2013.01)

(58) Field of Classification Search
CPC .............. H01L 29/785; H01L 29/66795
USPC ................ 257/12, 352; 438/46, 489
See application file for complete search history.

(56) References Cited

U.S. PATENT DOCUMENTS

| 5,494,891 A * | 2/1996 | Nakamura et al. ............ 505/330 |
| 6,093,947 A | 7/2000 | Hanafi et al. |
| 7,179,329 B2 | 2/2007 | Boone et al. |
| 7,550,784 B2 | 6/2009 | Saxler et al. |
| 8,344,418 B2 | 1/2013 | Rachmady et al. |
| 8,440,547 B2 | 5/2013 | Bedell et al. |
| 2012/0261754 A1 | 10/2012 | Cheng et al. |
| 2012/0326232 A1 | 12/2012 | Cheng et al. |
| 2013/0032812 A1 | 2/2013 | Kizilyalli et al. |

OTHER PUBLICATIONS

Dvorak, M.W. et al., "Abrupt Junction InP/GaAsSb/InP Double Heterojunction Bipolar Transistors with Fr as High as 250 GHz and BVceo >6V" IEEE, International Electron Devices Meeting, IEDM Conference Proceedings (Dec. 10-13, 2000) pp. 178-181.

(Continued)

*Primary Examiner* — William D Coleman
(74) *Attorney, Agent, or Firm* — Scully, Scott, Murphy & Presser, P.C.; Louis J. Percello, Esq.

(57) ABSTRACT

At least one doped semiconductor material region is formed over a crystalline insulator layer. A disposable gate structure and a planarization dielectric layer laterally surrounding the disposable gate structure are formed over the at least one doped semiconductor material region. The disposable gate structure is removed selective to the planarization dielectric layer to form a gate cavity. Portions of the at least one doped semiconductor material region are removed from underneath the gate cavity. Remaining portions of the at least one doped semiconductor material region constitute a source region and a drain region. A channel region is epitaxially grown from a physically exposed surface of the crystalline insulator layer. The channel region has a uniform thickness that can be less than the thickness of the source region and the drain region, and is epitaxially aligned to the crystalline insulator layer.

18 Claims, 10 Drawing Sheets

(56) References Cited

OTHER PUBLICATIONS

Chowdhury, S. et al., "Dispersion-free AlGaN/GaN CAVET with low Ron achieved with plasma MBE regrown channel with Mg-ion-implanted Current Blocking Layer" IEEE, Device Research Conference (DRC) (Jun. 21-23, 2010) pp. 201-202.

* cited by examiner

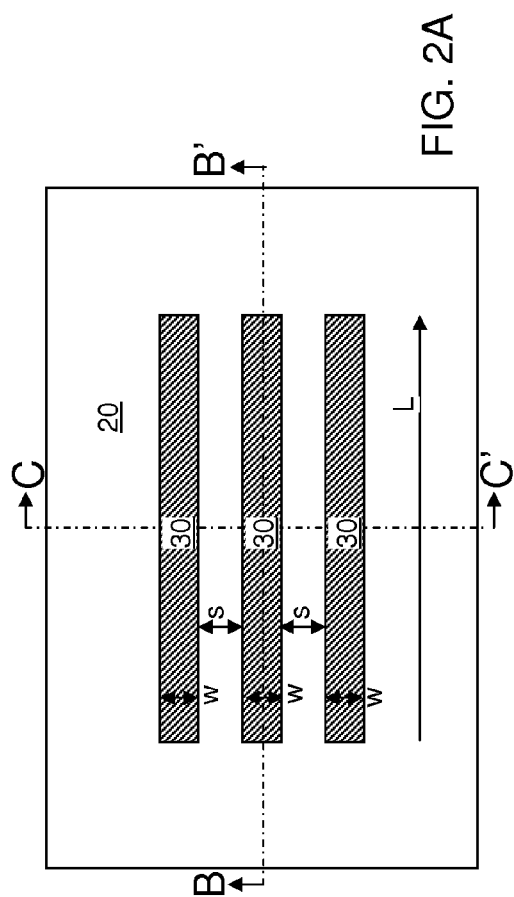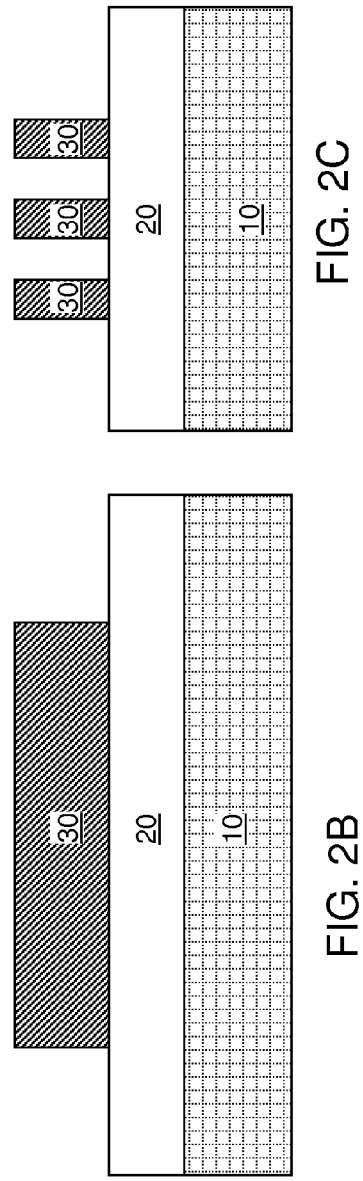

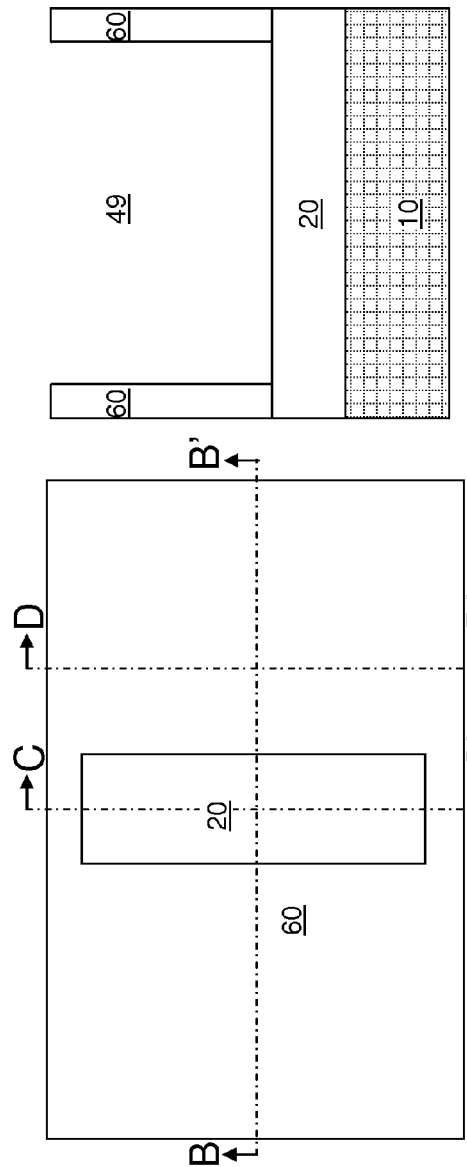
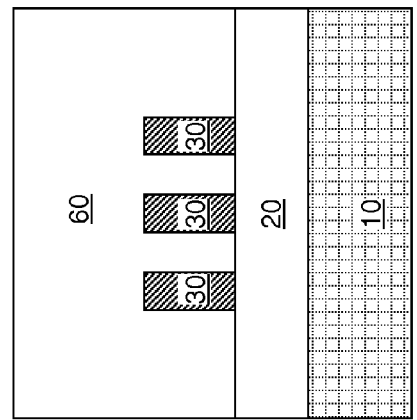
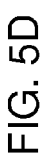
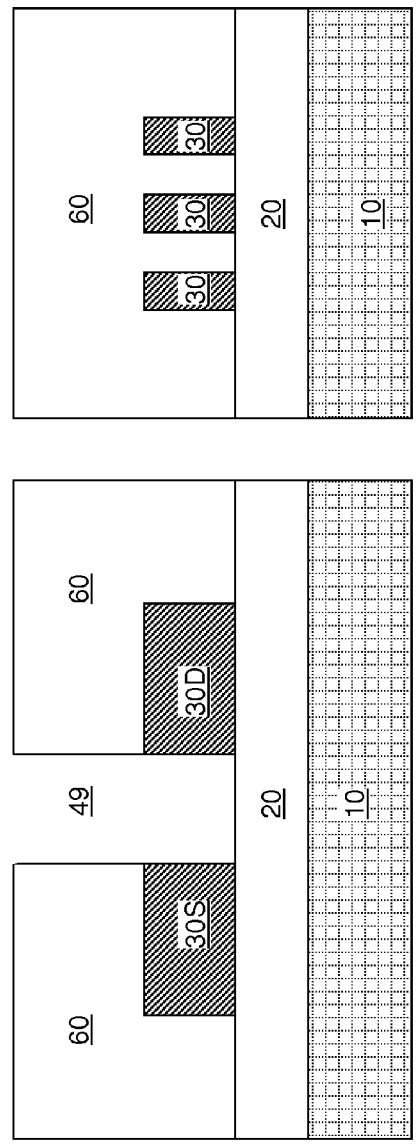
FIG. 5A
FIG. 5C
FIG. 5B
FIG. 5D

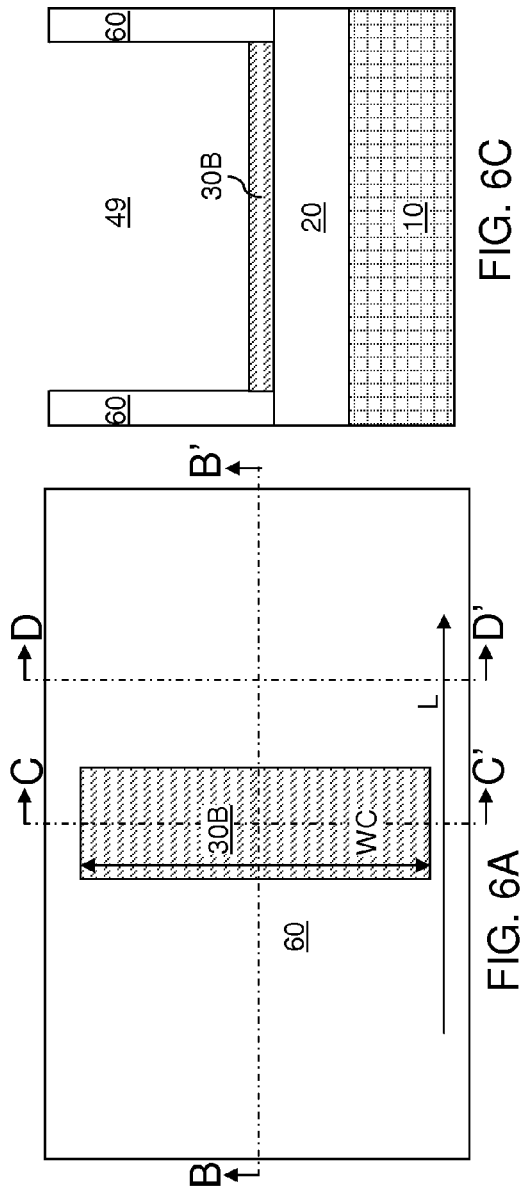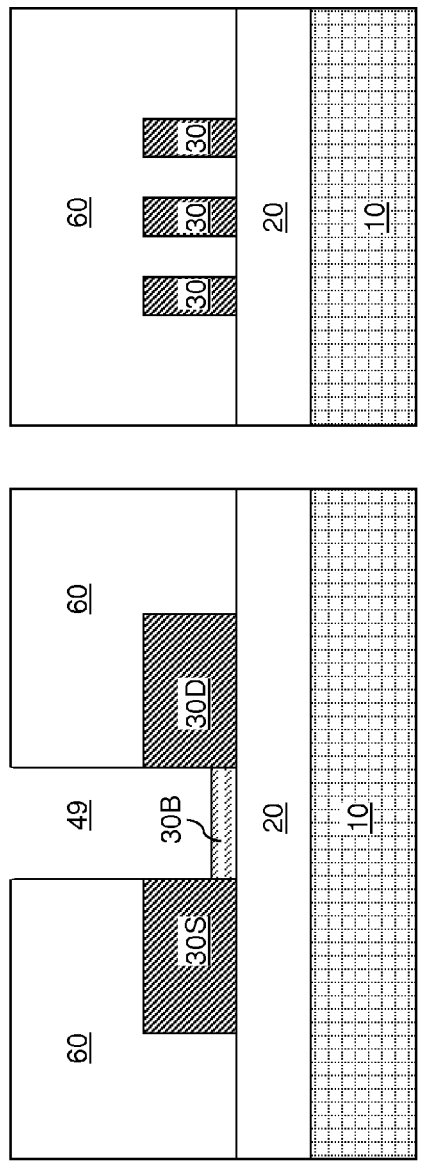

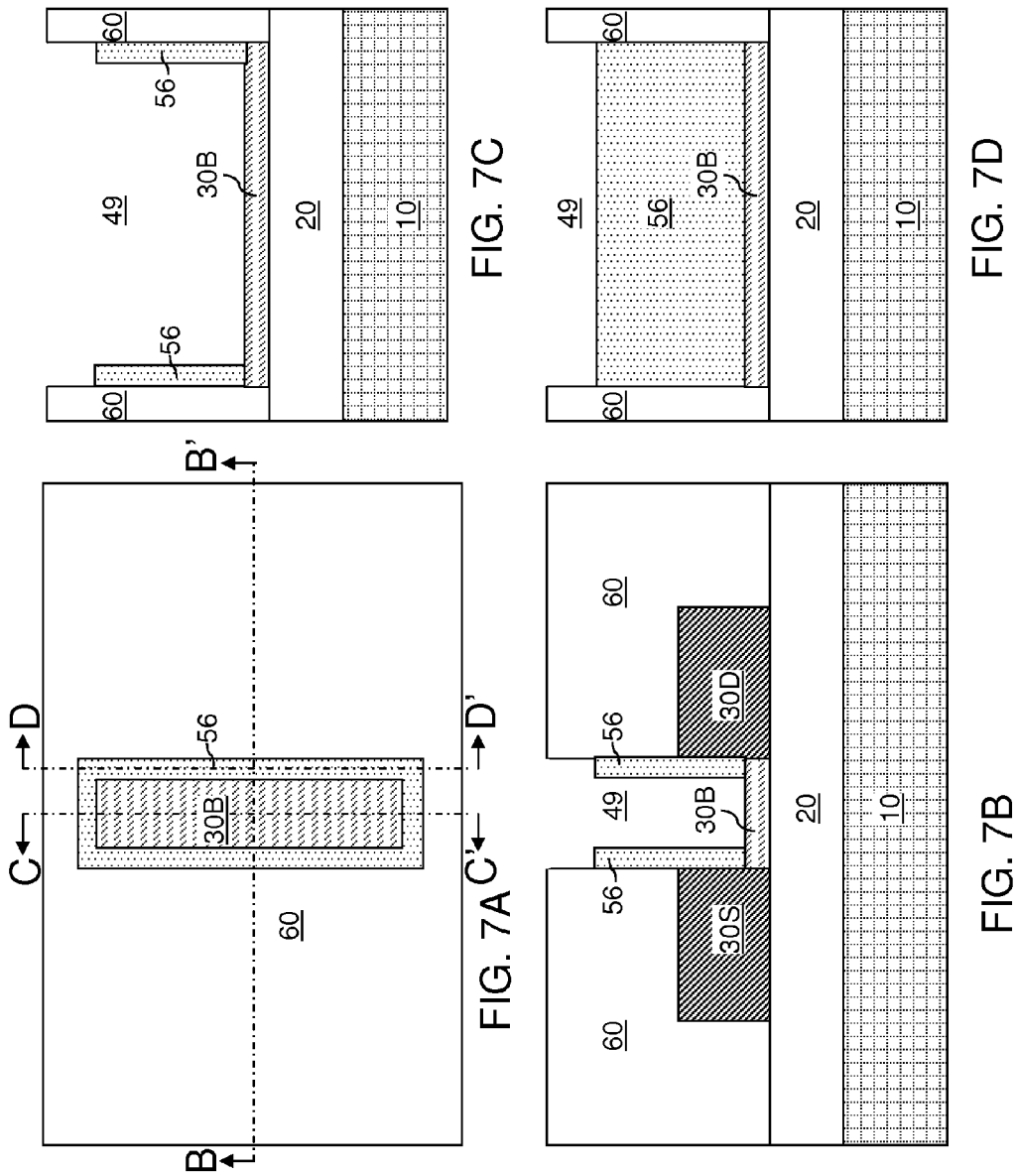

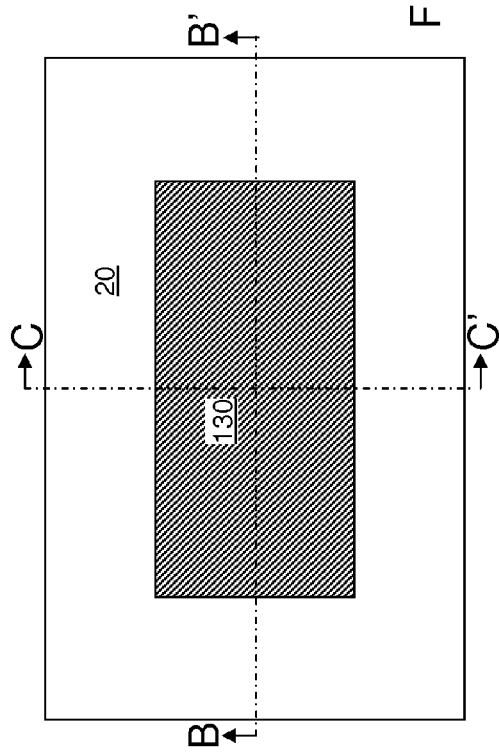
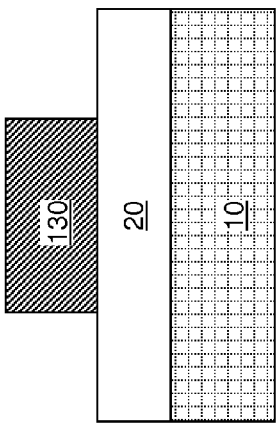
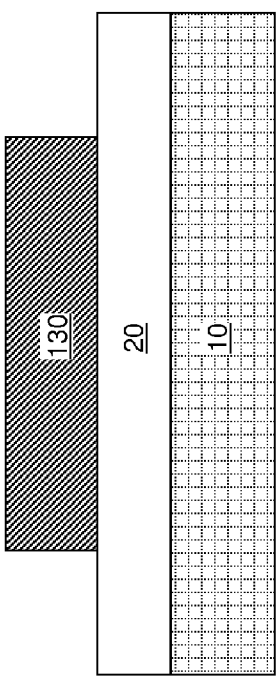
FIG. 9A
FIG. 9B
FIG. 9C

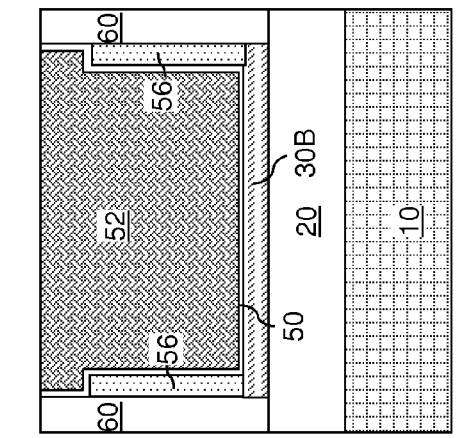
FIG. 10C
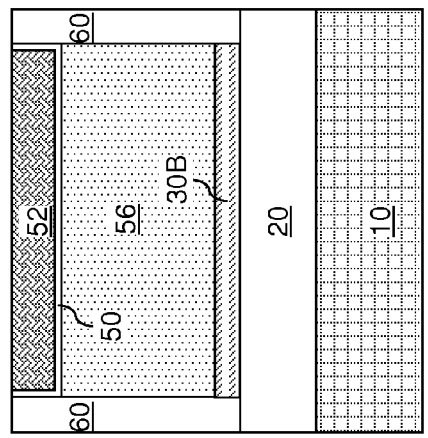
FIG. 10D
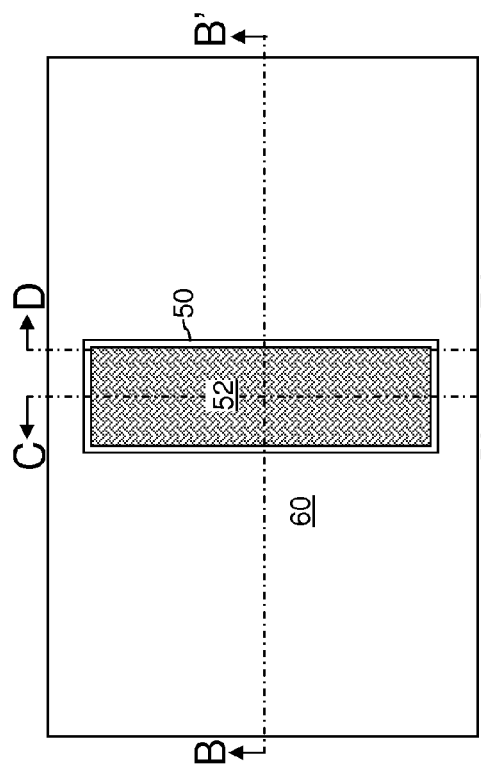
FIG. 10A
FIG. 10B
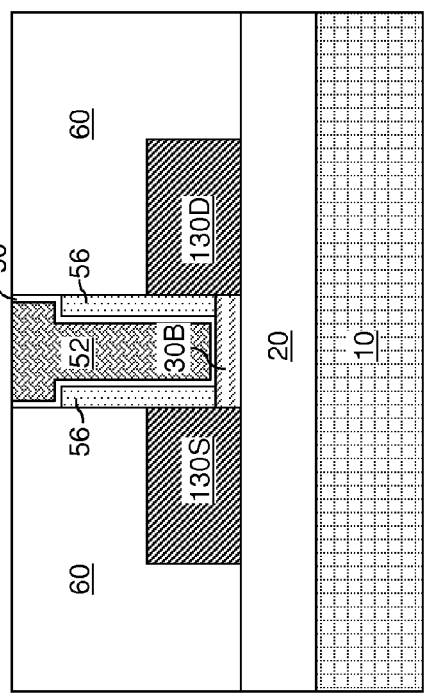

FIELD EFFECT TRANSISTOR INCLUDING A RECESSED AND REGROWN CHANNEL

BACKGROUND

The present disclosure relates to a semiconductor structure, and particularly to a field effect transistor including an epitaxially grown channel and a method of manufacturing the same.

Providing an abrupt junction for a field effect transistor including a compound semiconductor material channel is challenging due to the requirement of low temperature processing and the difficulty of dopant activation under such low temperature requirement.

SUMMARY

At least one doped semiconductor material region is formed over a crystalline insulator layer. A disposable gate structure and a planarization dielectric layer laterally surrounding the disposable gate structure are formed over the at least one doped semiconductor material region. The disposable gate structure is removed selective to the planarization dielectric layer to form a gate cavity. Portions of the at least one doped semiconductor material region are removed from underneath the gate cavity. Remaining portions of the at least one doped semiconductor material region constitute a source region and a drain region. A channel region is epitaxially grown from a physically exposed surface of the crystalline insulator layer. The channel region has a uniform thickness that can be less than the thickness of the source region and the drain region, and is epitaxially aligned to the crystalline insulator layer.

According to an aspect of the present disclosure, a semiconductor structure is provided. The semiconductor structure includes at least one source region located on a single crystalline insulator layer, at least one drain region located on the single crystalline insulator layer, and a planar channel region laterally contacting the at least one source region and the at least one drain region. The planar channel region includes a single crystalline semiconductor material that is epitaxially aligned to a crystallographic structure of the single crystalline insulator layer, and has a top surface that is more proximal to the single crystalline insulator layer than top surfaces of the at least one source region and the at least one drain region. The semiconductor structure further includes a gate dielectric having a bottommost surface that contacts the top surface of the planar channel region, and a gate electrode vertically spaced from the planar channel region by the gate dielectric.

According to another aspect of the present disclosure, a method of forming a semiconductor structure is provided. At least one semiconductor material portion is formed on a single crystalline insulator layer. A disposable gate structure is formed over the at least one semiconductor material portion. A planarization dielectric layer is formed over the at least one semiconductor material portion and around the disposable gate structure. A gate cavity is formed by removing the disposable gate structure. Each of the at least one semiconductor material portion is separated into a source region and a drain region by etching each sub-portion of the at least one semiconductor material portion from underneath the gate cavity. The gate cavity is extended during this process. A planar channel region including a single crystalline semiconductor material is grown from a top surface of the single crystalline insulator layer within the gate cavity. A gate dielectric and a gate electrode are formed on the planar channel region within the gate cavity.

BRIEF DESCRIPTION OF SEVERAL VIEWS OF THE DRAWINGS

FIG. 2A is a top-down view of the first exemplary semiconductor structure after formation of semiconductor fins on a crystalline insulator layer according to the first embodiment of the present disclosure.

FIG. 2B is a vertical cross-sectional view of the first exemplary semiconductor structure along the vertical plane B-B' in FIG. 2A.

FIG. 2C is a vertical cross-sectional view of the first exemplary semiconductor structure along the vertical plane C-C' in FIG. 2A.

FIG. 5A is a top-down view of the first exemplary semiconductor structure after removal of physically exposed portions of the semiconductor fins from underneath the gate cavity according to the first embodiment of the present disclosure.

FIG. 5B is a vertical cross-sectional view of the first exemplary semiconductor structure along the vertical plane B-B' in FIG. 5A.

FIG. 5C is a vertical cross-sectional view of the first exemplary semiconductor structure along the vertical plane C-C' in FIG. 5A.

FIG. 5D is a vertical cross-sectional view of the first exemplary semiconductor structure along the vertical plane D-D' in FIG. 5A.

FIG. 6A is a top-down view of the first exemplary semiconductor structure after formation of a planar channel region by selective epitaxy according to the first embodiment of the present disclosure.

FIG. 6B is a vertical cross-sectional view of the first exemplary semiconductor structure along the vertical plane B-B' in FIG. 6A.

FIG. 6C is a vertical cross-sectional view of the first exemplary semiconductor structure along the vertical plane C-C' in FIG. 6A.

FIG. 6D is a vertical cross-sectional view of the first exemplary semiconductor structure along the vertical plane D-D' in FIG. 6A.

FIG. 7A is a top-down view of the first exemplary semiconductor structure after formation of a gate spacer according to the first embodiment of the present disclosure.

FIG. 7B is a vertical cross-sectional view of the first exemplary semiconductor structure along the vertical plane B-B' in FIG. 7A.

FIG. 7C is a vertical cross-sectional view of the first exemplary semiconductor structure along the vertical plane C-C' in FIG. 7A.

FIG. 7D is a vertical cross-sectional view of the first exemplary semiconductor structure along the vertical plane D-D' in FIG. 7A.

FIG. 9A is a top-down view of a second exemplary semiconductor structure after formation of a semiconductor material portion according to a second embodiment of the present disclosure.

FIG. 9B is a vertical cross-sectional view of the second exemplary semiconductor structure along the vertical plane B-B' in FIG. 9A.

FIG. 9C is a vertical cross-sectional view of the second exemplary semiconductor structure along the vertical plane C-C' in FIG. 9A.

FIG. 10A is a top-down view of the second exemplary semiconductor structure after formation of a gate dielectric and a gate electrode according to the second embodiment of the present disclosure.

FIG. 10B is a vertical cross-sectional view of the exemplary semiconductor structure along the vertical plane B-B' in FIG. 10A.

FIG. 10C is a vertical cross-sectional view of the exemplary semiconductor structure along the vertical plane C-C' in FIG. 10A.

FIG. 10D is a vertical cross-sectional view of the exemplary semiconductor structure along the vertical plane D-D' in FIG. 10A.

DETAILED DESCRIPTION

Figure 1A:
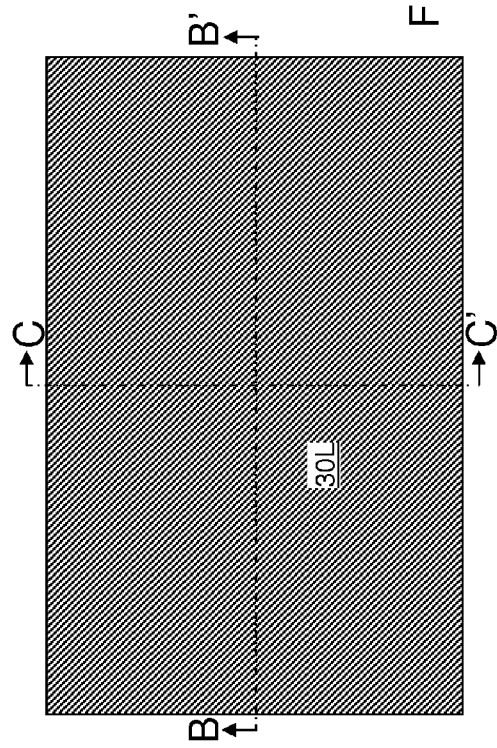
FIG. 1A is a top-down view of a first exemplary semiconductor structure upon providing a stack of a substrate, and insulator layer, and a single crystalline compound semiconductor material layer according to a first embodiment of the present disclosure.

As stated above, the present disclosure relates to a field effect transistor including an epitaxially grown channel and a method of manufacturing the same. Aspects of the present disclosure are now described in detail with accompanying figures. It is noted that like reference numerals refer to like elements across different embodiments. The drawings are not necessarily drawn to scale.

Figure 1C:
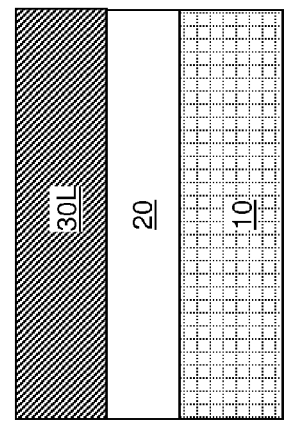
FIG. 1C is a vertical cross-sectional view of the first exemplary semiconductor structure along the vertical plane C-C' in FIG. 1A.
Figure 1B:
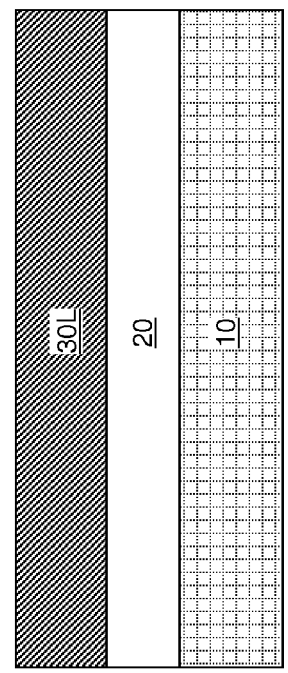
FIG. 1B is a vertical cross-sectional view of the first exemplary semiconductor structure along the vertical plane B-B' in FIG. 1A.

Referring to FIGS. 1A-1C, a first exemplary semiconductor structure according to an embodiment of the present disclosure includes a substrate 10, an insulator layer 20, a single crystalline compound semiconductor material layer 30L. The substrate 10 can be an insulator substrate, a conductive substrate, or a semiconducting substrate. In one embodiment, the substrate 10 can be a semiconductor substrate including silicon, germanium, a silicon-germanium alloy, a graded III-V compound semiconductor material, or combinations thereof. In one embodiment, the substrate 10 can include a single crystalline material on which the insulator layer 20 can be formed as a single crystalline material, for example, by epitaxial deposition. In one embodiment, the substrate 10 can be a single crystalline silicon substrate with a graded III-V compound material layer thereupon, or can be a single crystalline InP substrate.

The insulator layer 20 can be a single crystalline insulator layer including a single crystalline compound insulator material. As used herein, an insulator material refers to a material having a resistivity greater than $1.0 \times 10^3$ Ohm-cm. As used herein, a compound insulator material refers to an insulator material that includes a compound of at least two elements. The compound insulator material can be a III-V compound including a Group III element and a Group V element, or can be a II-V compound including a Group II element and a Group VI element. As used herein, a single crystalline compound insulator material refers to a compound insulator material that is single crystalline, i.e., having an epitaxial alignment among atoms throughout the entirety of the compound insulator material. In one embodiment, the single crystalline compound insulator material of the insulator layer 20 can be gallium arsenide.

The single crystalline compound semiconductor material layer 30L includes a single crystalline compound semiconductor material in epitaxial alignment with the single crystalline compound insulator material of the insulator layer 20. As used herein, a semiconducting material refers to a material having a resistivity less than $1.0 \times 10^3$ Ohm-cm and greater than $1.0 \times 10^{-3}$ Ohm-cm. As used herein, a semiconductor material refers to a material that can have a resistivity less than $1.0 \times 10^3$ Ohm-cm and greater than $1.0 \times 10^{-3}$ Ohm-cm upon suitable doping, i.e., can become a semiconducting material upon suitable doping. As used herein, a compound semiconductor material refers to a semiconductor material that includes a compound of at least two elements. The thickness of the single crystalline compound semiconductor material layer 30L can be in a range from 10 nm to 200 nm, although lesser and greater thicknesses can also be employed.

The single crystalline compound semiconductor material of the single crystalline compound semiconductor material layer 30L can be formed by epitaxial deposition with in-situ doping with electrical dopants. The electrical dopants can be p-type dopants or n-type dopants. The conductivity type of the single crystalline compound semiconductor material layer 30L is herein referred to as a first conductivity type. In one embodiment, the dopant concentration of the first conductivity type dopants within the single crystalline compound semiconductor material layer 30L can be in a range from $1.0 \times 10^{19}/cm^3$ to $5.0 \times 10^{21}/cm^3$, although lesser and greater dopant concentrations can also be employed. In one embodiment, the resistivity of the single crystalline compound semiconductor material layer 30L can be greater than $1.0 \times 10^{-5}$ Ohm-cm and less than $1.0 \times 10^{-2}$ Ohm-cm. In another embodiment, the single crystalline compound semiconductor material layer 30L can be conductive, and have a resistivity greater than $3.0 \times 10^{-5}$ Ohm-cm and less than $1.0 \times 10^{-3}$ Ohm-cm. As used herein, a material is conductive if the conductivity of the material is less than $1.0 \times 10^{-3}$ Ohm-cm.

Alternately or additionally, the single crystalline compound semiconductor material of the single crystalline compound semiconductor material layer 30L can be formed by epitaxial deposition and ion implantation of electrical dopants of the first conductivity type. The implanted electrical dopants can be electrically activated by an anneal at an elevated temperature, which can be in a range from 600 degree Celsius to 1,000 degree Celsius.

The single crystalline compound semiconductor material of the single crystalline compound semiconductor material layer 30L is in epitaxial alignment with the single crystalline compound insulator material of the insulator layer 20. In one embodiment, the single crystalline compound semiconductor material layer 30L can be formed by epitaxial deposition of the single crystalline compound semiconductor material upon the insulator layer 20. In one embodiment, metal organic chemical vapor deposition (MOCVD) can be employed to deposit the single crystalline compound semiconductor material layer 30L with epitaxial alignment to the insulator layer 20. In one embodiment, the single crystalline compound semiconductor material can be InGaAs.

Referring to FIGS. 2A-2C, at least one semiconductor material portion is formed on the insulator layer 20. Each of the at least one semiconductor material portion can be single crystalline, and can be epitaxially aligned to a crystallographic structure of the insulator layer 20.

In one embodiment, each of the at least one semiconductor material portion can be a semiconductor fin 30 having a pair of parallel vertical sidewalls. In one embodiment, the single crystalline compound semiconductor material layer 30L can be patterned to form a plurality of semiconductor fins 30. For example, a photoresist layer (not shown) can be applied over the single crystalline compound semiconductor material layer 30L. The photoresist layer is patterned by lithographic exposure and development to cover portions of the single crystalline compound semiconductor material layer 30L. The pattern in the photoresist layer can be selected such that the horizontal cross-sectional shapes of the patterned photoresist layer include parallelograms. In one embodiment, the horizontal cross-sectional shapes of the patterned photoresist layer include rectangular shapes each having a pair of lengthwise edges. As used herein, a lengthwise edge of a rectangle is an edge that is not a shortest edge. In one embodiment, the horizontal cross-sectional shapes of the patterned photoresist layer include a plurality of rectangular shapes having lengthwise edges that extend along a same horizontal direction, which is herein referred to as a lengthwise direction L.

The pattern in the photoresist layer can be transferred into the single crystalline compound semiconductor material layer 30L by an anisotropic etch to pattern the single crystalline compound semiconductor material layer 30L. A plurality of semiconductor fins 30 is formed on the top surface of the insulator layer 20 by remaining portions of the single crystalline compound semiconductor material layer 30L. The photoresist layer is subsequently removed, for example, by ashing.

Each of the plurality of semiconductor fins 30 can include the single crystalline compound semiconductor material, and can be epitaxially aligned to the single crystalline compound insulator material of the insulator layer 20. Each of the plurality of semiconductor fins 30 can have a pair of vertical sidewalls laterally extending along the lengthwise direction L. In one embodiment, each of the plurality of semiconductor fins 30 can have a width w throughout the entirety thereof. Thus, a pair of sidewalls of each semiconductor fin 30 can extend along the lengthwise direction L with a separation distance of the width w. In one embodiment, each of the plurality of semiconductor fins 30 can be laterally spaced from a neighboring semiconductor fin 30 by a spacing s.

Figure 3A:
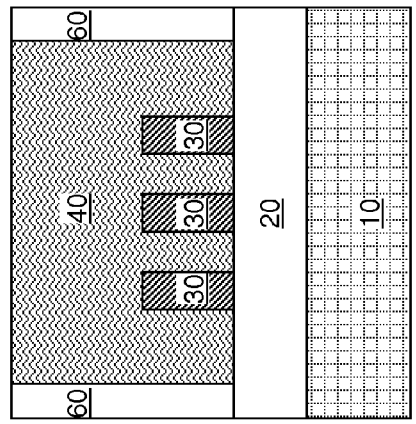
FIG. 3A is a top-down view of the first exemplary semiconductor structure after formation of a disposable gate structure and a planarization dielectric layer according to the first embodiment of the present disclosure.
Figure 3B:
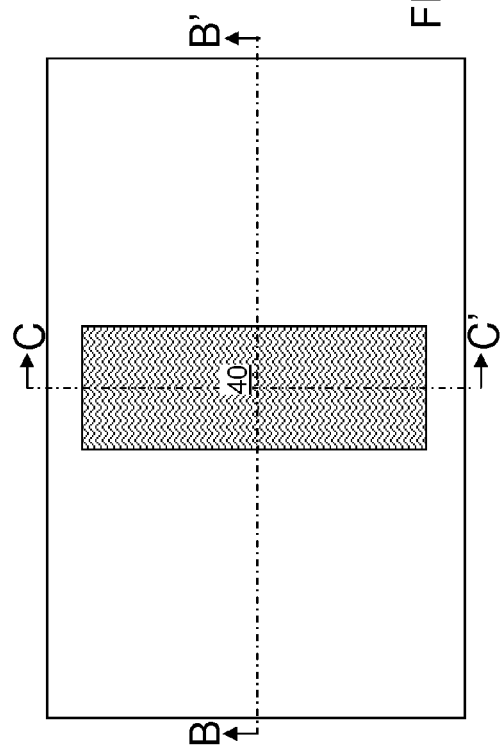
FIG. 3B is a vertical cross-sectional view of the first exemplary semiconductor structure along the vertical plane B-B' in FIG. 3A.
Figure 3C:
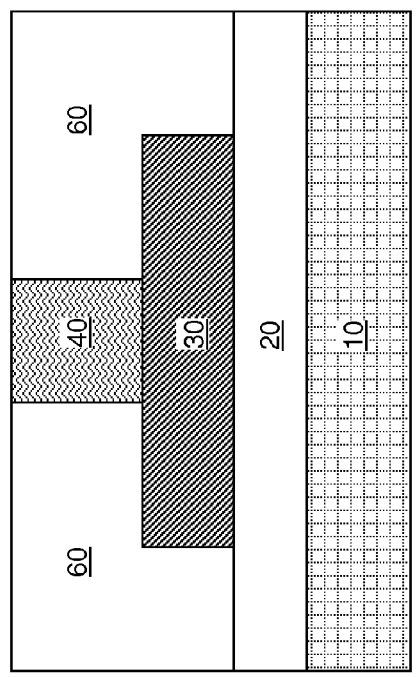
FIG. 3C is a vertical cross-sectional view of the first exemplary semiconductor structure along the vertical plane C-C' in FIG. 3A.

Referring to FIGS. 3A-3C, a disposable gate structure 40 is formed across the at least one semiconductor material portion such as the plurality of semiconductor fins 30. For example, a disposable material layer is deposited over the plurality of semiconductor fins 30 and the insulator layer, and is patterned to form the disposable gate structure 40. The patterning of the disposable material layer can be performed, for example, by application and patterning of a photoresist layer over the disposable material layer, and transfer of the pattern in the photoresist layer into the disposable material layer by an etch that employs the patterned photoresist layer as an etch mask. A remaining portion of the disposable material layer constitutes the disposable gate structure 40.

The disposable gate structure 40 straddles the plurality of semiconductor fins 30. The disposable gate structure 40 includes a material that can be removed selective to the single crystalline compound semiconductor material of the single crystalline compound semiconductor material layer 30L. For example, the disposable gate structure 40 can include a dielectric material such as organosilicate glass, silicon nitride, amorphous carbon, or a combination thereof. Alternately, the disposable gate structure 40 can include a semiconductor material that is different from the single crystalline compound semiconductor material of the single crystalline compound semiconductor material layer 30L. For example, the disposable gate structure 40 can include germanium or silicon.

A planarization dielectric layer 60 is deposited conformally over the plurality of semiconductor fins 30 and the disposable gate structure 40. For example, a planarizable dielectric material, i.e., a dielectric material that can be planarized, is conformally deposited, and is subsequently planarized. The planarization dielectric layer 60 can be planarized, for example, by chemical mechanical planarization (CMP). The top surface of the disposable gate structure 40 can be employed as a stopping surface during planarization of the planarization dielectric layer 60. The top surface of the planarization dielectric layer 60 can be coplanar with the top surface of the remaining portion of the disposable gate structure 40. The planarization dielectric layer 60 can include a dielectric material such a borosilicate glass (BSG), borophosphosilicate glass (BPSG), fluorosilicate glass (FSG), a porous or non-porous organosilicate glass (OSG), or silicon nitride. The planarization dielectric layer 60 is formed around the disposable gate structure 40, and embeds the disposable gate structure 40 and the plurality of semiconductor fins 30.

Figure 4A:
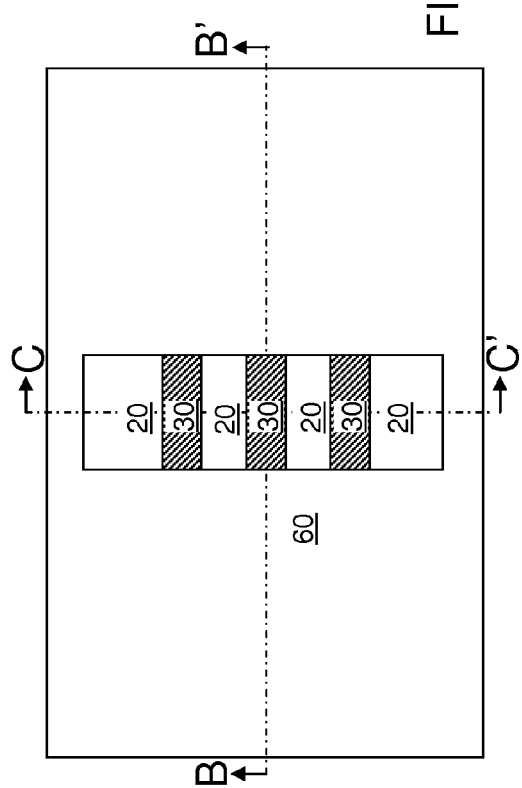
FIG. 4A is a top-down view of the first exemplary semiconductor structure after formation of a gate cavity by removal of the disposable gate structure according to the first embodiment of the present disclosure.
Figure 4C:
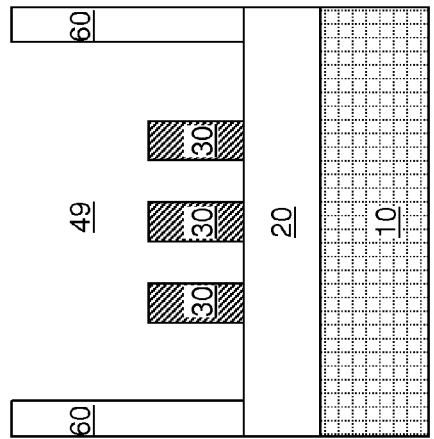
FIG. 4C is a vertical cross-sectional view of the first exemplary semiconductor structure along the vertical plane C-C' in FIG. 4A.
Figure 4B:
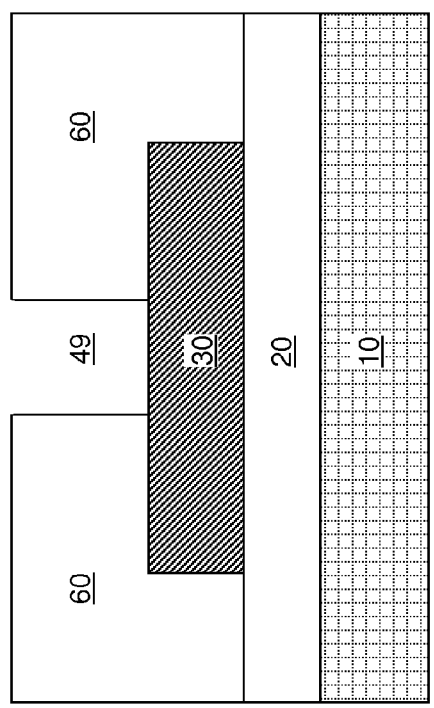
FIG. 4B is a vertical cross-sectional view of the first exemplary semiconductor structure along the vertical plane B-B' in FIG. 4A.
Figure 8A:
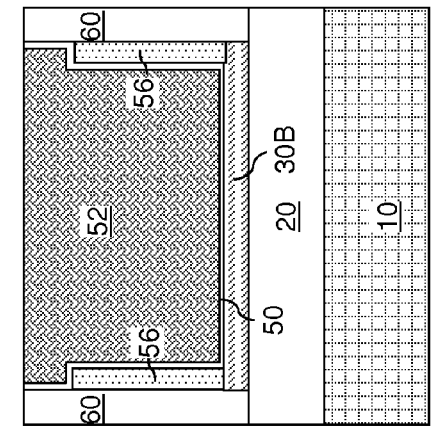
FIG. 8A is a top-down view of the first exemplary semiconductor structure after formation of a gate dielectric and a gate electrode according to the first embodiment of the present disclosure.
Figure 8C:
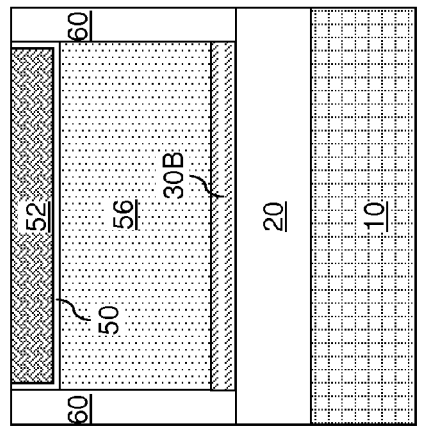
FIG. 8C is a vertical cross-sectional view of the first exemplary semiconductor structure along the vertical plane C-C' in FIG. 8A.
Figure 8B:
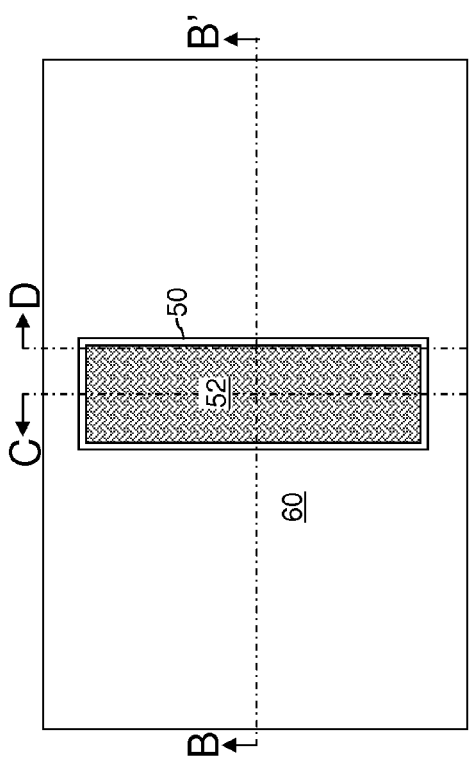
FIG. 8B is a vertical cross-sectional view of the first exemplary semiconductor structure along the vertical plane B-B' in FIG. 8A.
Figure 8D:
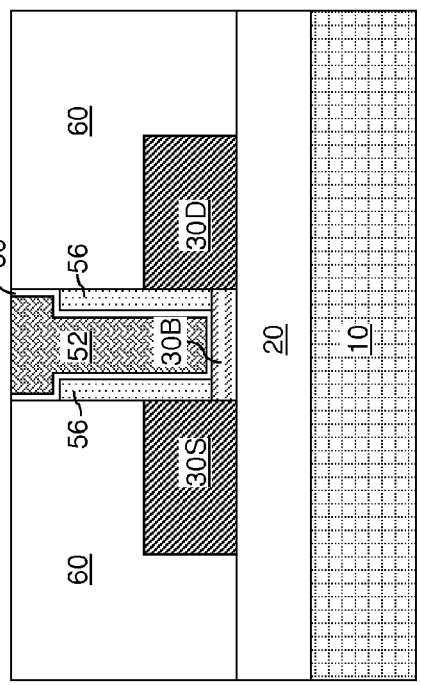
FIG. 8D is a vertical cross-sectional view of the first exemplary semiconductor structure along the vertical plane D-D' in FIG. 8A.

Referring to FIGS. 4A-4C, the disposable gate structure 40 is removed selective to the materials of the planarization dielectric layer 60 and the plurality of semiconductor fins 30 by an etch, which can be a wet etch or a dry etch. A gate cavity 49 is formed in the volume from which the disposable gate structure 40 is removed. The surfaces of the planarization dielectric layer 60 are amorphous surfaces.

Referring to FIGS. 5A-5D, physically exposed portions of the at least one semiconductor material portion (such as the plurality of semiconductor fins 30) are removed from underneath the gate cavity 49 by an anisotropic etch that employs the planarization dielectric layer 60 as an etch mask. The gate cavity is extended to include the volumes of the removed portions of the at least one semiconductor material portion. The anisotropic etch can be selective to the material of the insulator layer 20.

Each of the at least one semiconductor material portion is separated into a source region 30S and a drain region 30D by etching each sub-portion of the at least one semiconductor material portion from underneath the gate cavity 49. In one embodiment, each of the plurality of semiconductor fins 30 is separated into a source region 30S and a drain region 30D. After formation of the at least one source region 30S and the at least one drain region 30D, all sidewalls of the gate cavity 49 can be vertical, and can extend from the top surface of the insulator layer 20 to a top surface of the planarization dielectric layer 60. A sidewall of each source region 30S can be vertically coincident with a sidewall of the planarization dielectric layer 60. As used herein, a first surface is vertically coincident with a second surface if there exists a vertical plane that includes the first surface and the second surface. A sidewall of each drain region 30D can be vertically coincident with a sidewall of the planarization dielectric layer 60.

Referring to FIGS. 6A-6D, a planar channel region 30B can be formed by selective epitaxy of a semiconductor material on the physically exposed surfaces of the insulator layer 20 within the gate cavity 49. The planar channel region 30B includes a single crystalline semiconductor material that grows from the top surface of the insulator layer 20. The single crystalline semiconductor material of the planar channel region 30B can be epitaxially aligned to the crystallographic structure of the single crystalline compound insulator material of the insulator layer 20. The planar channel region 30B has a uniform thickness throughout the entirety thereof, and functions as a channel of a field effect transistor. In one embodiment, the planar channel region 30B can include a single crystalline compound semiconductor material, which can be the same as, or different from, the compound semiconductor material of the at least one source region 30S and the at least one drain region 30D. In one embodiment, the planar channel region 30B, the at least one source region 30S, and the at least one drain region 30D can include InGaAs.

In one embodiment, the at least one source region 30S and the at least one drain region 30D includes a single crystalline compound semiconductor material having a doping of the first conductivity type, and the planar channel region has a doping of a second conductivity type that is the opposite of the first conductivity type. In one embodiment, the first conductivity type is p-type and the second conductivity type is n-type. In another embodiment, the first conductivity type is n-type and the second conductivity type is p-type.

In one embodiment, the selective epitaxy process can provide growth of the single crystalline semiconductor material from the top surface of the insulator layer 20 while suppressing growth of the single crystalline semiconductor material from surfaces of the at least one source region 30S and the at least one drain region 30D. For example, the orientations of the plurality of semiconductor fins 30 (See FIGS. 2A-2C) can be selected such that the physically exposed sidewall surfaces of the at least one source region 30S and the at least one drain region 30D within the gate cavity 49 can be {110} surface orientations, and the surface orientation of the physically exposed top surface of the insulator layer 20 within the gate cavity can have a (001) surface orientation. In this case, the deposition rate of a single crystalline compound semiconductor material can be greater on the top surface of the insulator layer 20 having the (001) surface orientation than on the sidewall surfaces having {110} surface orientations. The ratio of the reactant flow to the etchant flow during the selective epitaxy process, deposition of the single crystalline compound semiconductor material of the planar channel region 30B can proceed only vertically from the top surface of the insulator layer 20, and growth of a compound semiconductor material from the sidewalls of the at least one source region 30S and the at least one drain region 30D can be suppressed.

The thickness of the planar channel region 30B is less than the height of the at least one source region 30S and the at least one drain region 30D. Upon termination of growth of the planar channel region 30B, a top surface of the planar channel region 30B is more proximal to the top surface of the insulator layer 20 than top surfaces of the at least one source region 30S and the at least one drain region 30D are to the top surfaces of the insulator layer 20. The thickness of the planar channel region 30B can be in a range from 3 nm to 100 nm, although lesser and greater thicknesses can also be employed. The thickness of the planar channel region 30B can be optimized for device performance. The width WC of the planar channel region 30B in the direction perpendicular to the lengthwise direction L is greater than the sum of all widths of the at least one source region 30S, or the sum of all widths of the at least one drain region 30D.

Referring to FIGS. 7A-7D, a gate spacer 56 can be formed within the gate cavity 49 by conformally depositing a dielectric material layer over the planar channel region 30B, and by anisotropically etching the dielectric material layer selective to the semiconductor material of the planar channel region 30B and the dielectric material of the planarization dielectric layer 60. The gate spacer 56 includes a dielectric material that is different from the dielectric material of the planarization dielectric layer 60. For example, the planarization dielectric layer 60 can include silicon oxide or organosilicate glass (OSG), and the gate spacer 56 can include silicon nitride. The gate spacer 56 is formed directly on sidewalls of the at least one source region 30S and the at least one drain region 30D. The thickness of the gate spacer 56 can be in a range from 1 nm to 30 nm, although lesser and greater thicknesses can also be employed.

Referring to FIGS. 8A-8D, a gate structure (50, 52) including a gate dielectric 50 and a gate electrode 52 can be formed to fill the gate cavity 49 (See FIGS. 7A-7D). The gate structure (50, 52) can be formed, for example, by depositing a stack of a gate dielectric layer and a gate conductor layer to fill the gate cavity 49, and by removing excess portions of the gate dielectric layer and the gate conductor layer from above the top surface of the planarization dielectric layer 60.

The gate dielectric layer can include a dielectric oxide and/or a dielectric nitride of a semiconductor material (such as silicon oxide and/or silicon nitride), and/or can include a dielectric metal oxide or a dielectric metal nitride (such as $HfO_2$, $ZrO_2$, $HfO_xN_y$, $ZrO_xN_y$) or any other high dielectric constant (high-k) gate dielectric material having a dielectric constant greater than 7.9 as known in the art. The gate dielectric layer can be formed by thermal and/or plasma oxidation, thermal and/or plasma nitridation, atomic layer deposition (ALD), chemical vapor deposition (CVD), or a combination thereof. The thickness of the gate dielectric layer can be from 1 nm to 6 nm, although lesser and greater thicknesses can also be employed. The gate conductor layer includes at least one conductive material, which can be at least one doped semiconductor material and/or at least one metallic material.

The first exemplary semiconductor structure includes at least one source region 30S located on the insulator layer 20, at least one drain region 30D located on the insulator layer 20, and the planar channel region 30B laterally contacting the at least one source region 30S and the at least one drain region 30D. The insulator layer 20 can be a single crystalline insulator layer. The planar channel region 30B can include a single crystalline semiconductor material that is epitaxially aligned to a crystallographic structure of the single crystalline insulator layer. The planar channel region 30B has a top surface that is more proximal to the single crystalline insulator layer than top surfaces of the at least one source region 30S and the at least one drain region 30D. The first exemplary semiconductor structure further includes a gate dielectric 50 having a bottommost surface that contacts the top surface of the planar channel region 30B, and a gate electrode 52 vertically spaced from the planar channel region 30B by the gate dielectric 50.

Each of the at least one source region 30S and the at least one drain region 30D can be single crystalline, and can be epitaxially aligned to the crystallographic structure of the single crystalline insulator layer. The gate spacer laterally surrounds at least a lower portion of the gate electrode 52. The planarization dielectric layer 60 has a top surface that is coplanar with the top surface of the gate electrode 52. Vertical sidewalls of the planarization dielectric layer 60 can be vertically coincident with sidewalls of the at least one source region 30S and the at least one drain region 30D. Outer sidewalls of the gate spacer 56 can be vertically coincident with sidewalls of the at least one source region 30S and the at least one drain region 30D. A portion of the gate dielectric 50 overlies the gate spacer 56, and includes outer sidewalls that are vertically coincident with the outer sidewalls of the gate spacer 56.

The at least one source region 30S and the at least one drain region 30D have a doping of the first conductivity type, and the planar channel region 30B has a doping of a second conductivity type that is the opposite of the first conductivity type. Each of the at least one source region 30S and the at least one drain region 30D can be a semiconductor fin having a pair of parallel vertical sidewalls. All bottom surfaces of the planar channel region 30B, the at least one source region 30S, and the at least one drain region 30D can be coplanar with the top surface of the single crystalline insulator layer.

Referring to FIGS. 9A-9C, a second exemplary semiconductor structure according to a second embodiment of the present disclosure can be derived from the first exemplary semiconductor structure of FIGS. 1A-1C by forming a contiguous semiconductor material portion 130 in lieu of a plurality of semiconductor fins 30 shown in FIGS. 2A-2C. The contiguous semiconductor material portion 130 can have a rectangular horizontal cross-sectional area, and can have a uniform height and a uniform width.

Referring to FIGS. 10A-10D, the processing steps of FIGS. 3A-3C, 4A-4C, 5A-5D, 6A-6D, 7A-7D, and 8A-8D can be sequentially performed to form the second exemplary semiconductor structure illustrated in FIGS. 10A-10D. The second exemplary semiconductor structure includes a contiguous source region 130S and a contiguous drain region 130D in lieu of a plurality of source regions 30S and a plurality of drain regions 30D, respectively, in the first exemplary semiconductor structure illustrated in FIGS. 8A-8D.

Because the materials of the source region(s) (30S or 130S) and the drain region(s) (30D or 130D) are formed prior to formation of the planar channel region 30B and the gate electrode 52, dopant activation in the source region(s) (30S or 130S) and the drain region(s) (30D or 130D) can be performed without regard to any thermal constraint on the planar channel region 30B and the gate electrode 52. Further, the source region(s) (30S or 130S) and the drain region(s) (30D or 130D) are self-aligned to the planar channel region 30B and the gate electrode 52 with minimal diffusion of electrical dopants into the planar channel region 30B.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:
    at least one source region located on a single crystalline insulator layer;
    at least one drain region located on said single crystalline insulator layer;
    a planar channel region laterally contacting said at least one source region and said at least one drain region, said planar channel region including a single crystalline semiconductor material that is epitaxially aligned to a crystallographic structure of said single crystalline insulator layer and having a top surface that is more proximal to said single crystalline insulator layer than top surfaces of said at least one source region and said at least one drain region;
    a gate dielectric having a bottommost surface that contacts said top surface of said planar channel region;
    a gate electrode vertically spaced from said planar channel region by said gate dielectric; and
    a gate spacer laterally surrounding at least a lower portion of said gate electrode.

2. The semiconductor structure of claim 1, wherein each of said at least one source region and said at least one drain region is single crystalline and is epitaxially aligned to said crystallographic structure of said single crystalline insulator layer.

3. The semiconductor structure of claim 1, further comprising a planarization dielectric layer having a top surface that is coplanar with a top surface of said gate electrode.

4. The semiconductor structure of claim 1, wherein outer sidewalls of said gate spacer are vertically coincident with sidewalls of said at least one source region and said at least one drain region.

5. The semiconductor structure of claim 1, wherein said at least one source region and said at least one drain region have a doping of a first conductivity type, and said planar channel region has a doping of a second conductivity type that is the opposite of said first conductivity type.

6. The semiconductor structure of claim 1, wherein all bottom surfaces of said planar channel region, said at least one source region, and said at least one drain region are coplanar with a top surface of said single crystalline insulator layer.

7. The semiconductor structure of claim 3, wherein vertical sidewalls of said planarization dielectric layer are vertically coincident with sidewalls of said at least one source region and said at least one drain region.

8. The semiconductor structure of claim 4, wherein a portion of said gate dielectric overlies said gate spacer and includes outer sidewalls that are vertically coincident with said outer sidewalls of said gate spacer.

9. A semiconductor structure comprising:
    at least one source region located on a single crystalline insulator layer;
    at least one drain region located on said single crystalline insulator layer;
    a planar channel region laterally contacting said at least one source region and said at least one drain region, said planar channel region including a single crystalline semiconductor material that is epitaxially aligned to a crystallographic structure of said single crystalline insulator layer and having a top surface that is more proximal to said single crystalline insulator layer than top surfaces of said at least one source region and said at least one drain region;

a gate dielectric having a bottommost surface that contacts said top surface of said planar channel region; and a gate electrode vertically spaced from said planar channel region by said gate dielectric, wherein each of said at least one source region and said at least one drain region is a semiconductor fin having a pair of parallel vertical sidewalls.

10. A method of forming a semiconductor structure comprising:

forming at least one semiconductor material portion on a single crystalline insulator layer;

forming a disposable gate structure over said at least one semiconductor material portion;

forming a planarization dielectric layer over said at least one semiconductor material portion;

forming a gate cavity by removing said disposable gate structure;

separating each of said at least one semiconductor material portion into a source region and a drain region by etching each sub-portion of said at least one semiconductor material portion;

growing a planar channel region comprising a single crystalline semiconductor material from a top surface of said single crystalline insulator layer between said at least one source region and said at least one drain region; and forming a gate dielectric and a gate electrode on said planar channel region within said gate cavity.

11. The method of claim 10, further comprising planarizing said planarization dielectric layer employing a top surface of said disposable gate structure as a stopping surface.

12. The method of claim 10, further comprising forming a gate spacer on sidewalls of said gate cavity after formation of said planar channel region.

13. The method of claim 10, wherein all sidewalls of said gate cavity are vertical and extends from said top surface of said single crystalline insulator layer to a top surface of said planarization dielectric layer after formation of said at least one source region and said at least one drain region.

14. The method of claim 10, wherein, upon termination of growth of said planar channel region, a top surface of said planar channel region is more proximal to said top surface of said single crystalline insulator layer than top surfaces of said at least one source region and said at least one drain region.

15. The method of claim 10, wherein said at least one semiconductor material portion has a doping of a first conductivity type, and said planar channel region has a doping of a second conductivity type that is the opposite of said first conductivity type.

16. The method of claim 10, wherein said planar channel region is formed by a selective epitaxy process that provides growth of said single crystalline semiconductor material from said top surface of said single crystalline insulator layer while suppressing growth of said single crystalline semiconductor material from surfaces of said at least one source region and said at least one drain region.

17. The method of claim 10, wherein said at least one semiconductor material portion is single crystalline and is epitaxially aligned to a crystallographic structure of said single crystalline insulator layer.

18. A method of forming a semiconductor structure comprising:

forming at least one semiconductor material portion on a single crystalline insulator layer, wherein each of said at least one semiconductor material portion is a semiconductor fin having a pair of parallel vertical sidewalls forming a planarization dielectric layer over said at least one semiconductor material portion;

separating each of said at least one semiconductor material portion into a source region and a drain region by etching each sub-portion of said at least one semiconductor material portion;

growing a planar channel region comprising a single crystalline semiconductor material from a top surface of said single crystalline insulator layer between said at least one source region and said at least one drain region; and forming a gate dielectric and a gate electrode on said planar channel region within said gate cavity.

* * * * *